United States Patent
Arai

(10) Patent No.: US 8,298,921 B2
(45) Date of Patent: Oct. 30, 2012

(54) SEMICONDUCTOR DEVICE AND METHOD OF MONITORING BLOWING OF FUSE IN SEMICONDUCTOR DEVICE

(75) Inventor: Hiroyuki Arai, Oizumi-machi (JP)

(73) Assignee: Semiconductor Components Industries, LLC, Phoenix, AZ (US)

(*) Notice: Subject to any disclaimer, the term of this patent is extended or adjusted under 35 U.S.C. 154(b) by 290 days.

(21) Appl. No.: 12/833,546

(22) Filed: Jul. 9, 2010

(65) Prior Publication Data

US 2011/0006834 A1    Jan. 13, 2011

(30) Foreign Application Priority Data

Jul. 10, 2009   (JP) .................................. 2009-164035

(51) Int. Cl.
*H01L 21/326* (2006.01)

(52) U.S. Cl. ...................................... 438/467; 257/209

(58) Field of Classification Search ................... 257/209; 438/467

See application file for complete search history.

(56) References Cited

U.S. PATENT DOCUMENTS 7,705,418 B2    4/2010   Kono et al.
2006/0289898 A1   12/2006   Kono et al.

FOREIGN PATENT DOCUMENTS

JP    2007-005424 A    1/2007

*Primary Examiner* — Douglas Menz
(74) *Attorney, Agent, or Firm* — Westerman, Hattori, Daniels & Adrian, LLP

(57) ABSTRACT

In some embodiments, a semiconductor device includes a fuse having a conductive portion configured to be blown when a current exceeding a rated value flows through the conductive portion, a first monitor wiring configured to monitor blowing of the conductive portion of the fuse, and a second monitor wiring configured to monitor blowing of the conductive portion of the fuse. The first monitor wiring and the second monitor wiring are connected to the conductive portion of the fuse so as to be away from a longitudinal center of the conductive portion.

16 Claims, 6 Drawing Sheets dinal intermediate portion of the conductive portion 3. The

SEMICONDUCTOR DEVICE AND METHOD OF MONITORING BLOWING OF FUSE IN SEMICONDUCTOR DEVICE

This application claims priority under 35 U.S.C. §119 to Japanese Patent Application No. 2009-164035 filed on Jul. 10, 2009, the entire disclosure of which is incorporated herein by reference in its entirety.

BACKGROUND OF THE INVENTION

1. Field of the Invention

Some preferred embodiments of the present invention relate to a semiconductor device, and more specifically to a semiconductor device equipped with a fuse for changing circuit wiring in the semiconductor by blowing the fuse, and also relate to a method of monitoring blowing of a fuse in a semiconductor device.

2. Description of the Related Art

The following description sets forth the inventor's knowledge of related art and problems therein and should not be construed as an admission of knowledge in the prior art.

In recently developing semiconductor devices, for the purpose of enhancing the versatility, it has become popular to change the semiconductor status settings not by changing the mask pattern of the semiconductor device but by blowing fuses mounted in an inner side of the semiconductor to change the wiring connection to thereby, for example, disconnect defective devices and connect redundancy circuits.

In order to change the wiring connection by blowing a fuse to disconnect a part of wiring in a semiconductor device, fusing circuits, such as, e.g., fuse patterns, are formed in the semiconductor device in addition to the electric circuit patterns. An electric stress is applied to both ends of the fusing circuit to blow the fuse element to thereby electrically disconnect the wiring to change the wiring connection (see, e.g., Japanese Unexamined Laid-open Patent Application Publication No. 2007-5424).

FIG. 6(*a*) shows a schematic view showing an example of a conventional fuse for a semiconductor device. As shown in this figure, the fuse F includes a linear conductive portion 3 and a pair of pads 1 and 2 electrically connected to both ends of the conductive portion 3. The conductive portion 3 arranged between the pads 1 and 2 has a thinner width so that the conductive portion 3 can produce heat by locally increased current density to be blown when a relatively small amount of current flows therethrough. The fuse F shown in FIG. 6(*a*) is in a state in which the fuse is not blown. When the conductive portion 3 of the fuse F is blown, as shown in FIGS. 6(*b*) and 6(*c*), a clearance "C" will be formed at the longitu clearance "C" is defined by and between the left side remaining portion 3*a* of the conductive portion 3 and the right side remaining portion 3*b* of the conductive portion 3. FIG. 6(*c*) shows a blown state of the fuse in which the sufficiently large clearance "C" is formed. In some cases, however, as shown in FIG. 6(*b*), there is a possibility that the fuse blows such that the clearance "C" is very small due to variations of applied stresses.

When confirming the fuse-blowing in a semiconductor device with an IC tester, although such an IC tester measures electrically to confirm whether the fuse is blown, the tester cannot measure the clearance "C" (i.e., distance) of the blown-off portion of the fuse F. Accordingly, if there is a clearance "C," the IC tester indicates that the fuse is blown regardless of the size of the clearance "C." However, when the clearance "C" between the remaining portions of the fuse F is insufficiently small, the remaining portions of the fuse may sometimes reconnect due to, e.g., temperature stress or force stress. This deteriorates the reliability of the semiconductor.

Especially, in a semiconductor device for use in automobiles, it should be considered to be used under severe conditions, such as, e.g., under extremely high temperatures during high temperature seasons in summer. Thus, such a semiconductor is required to possess high reliability. However, conventional semiconductors equipped with such fuses are not reliable in terms of blowing the fuses.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a semiconductor device equipped with a fuse for changing circuit wiring in the semiconductor with high reliablity.

Among other potential advantages, some embodiments can provide a method of monitoring blowing of a fuse for use in a semiconductor device with high reliability.

According to a first aspect of the present invention, among other potential advantages, some embodiments can provide a semiconductor device including a fuse having a conductive portion configured to be blown when a current exceeding a rated value flows through the conductive portion, a first monitor wiring configured to monitor blowing of the conductive portion of the fuse, and a second monitor wiring configured to monitor blowing of the conductive portion of the fuse. The first monitor wiring is connected to the conductive portion of the fuse so as to be away from a longitudinal center of the conductive portion, and the second monitor wiring is connected to the conductive portion of the fuse so as to be away from a longitudinal center of the conductive portion.

In some examples, it can be configured such that the fuse has a pair of pads and a conductive portion electrically connecting the pads and the first and second monitor wirings each include a pad and a wiring portion. The wiring portion of the first monitor wiring is connected to a first portion of the conductive portion of the fuse which is away from the longitudinal center of the conductive portion by a certain distance, and the wiring portion of the second monitor wiring is connected to a second portion of the conductive portion of the fuse which is away from the longitudinal center of the conductive portion by a certain distance.

In some examples, it can be configured such that the first portion and the second of the conductive portion are away from the longitudinal center of the conductive portion in the same or opposite longitudinal directions of the conductive portion. The pads of the first and second monitor wirings can be arranged at any portions around the fuse.

In some examples, it can be configured such that the semiconductor device further includes third and fourth monitor wirings configured to monitor blowing of the conductive portion of the fuse. The third and fourth monitor wirings each include a pad and a wiring portion. The first and second monitor wirings are arranged at one side of the fuse and the third and fourth monitor wirings are arranged at the other side of the fuse.

According to a second aspect of the present invention, some preferred embodiments provide a method of monitoring blowing of a fuse in a semiconductor device, the method comprising:

providing a fuse in the semiconductor device, the fuse having a conductive portion configured to be blown when a current exceeding a rated value flows through the conductive portion;

providing a first monitor wiring and a second monitor wiring in the semiconductor device so that the first and second monitor wirings are connected to the conductive portion of the fuse so as to be away from a longitudinal center of the conductive portion, the first monitor wiring and the second monitor wiring being configured to monitor blowing of the conductive portion of the fuse; and monitoring electric disconnection of the conductive portion of the fuse using the first monitor wiring and second monitor wiring to confirm, after blowing of the conductive portion of the fuse, whether or not remaining portions of the fuse and the first and second monitor wirings are electrically disconnected with each other.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which:

FIG. 1 is a schematic view showing a fuse for use in semiconductor devices according to a first embodiment of the present invention, wherein FIG. 1(a) shows a fuse in a state in which the fuse is not blown, FIGS. 1(b) and 1(c) show a fuse in a state in which the fuse is blown.

FIG. 2 is a schematic view showing a fuse for use in semiconductor devices according to a second embodiment of the present invention, wherein FIG. 2(a) shows a fuse in a state in which the fuse is not blown, FIGS. 2(b) and 2(c) each show a fuse in a state in which the fuse is blown;

FIG. 3 is a schematic view showing a fuse for use in semiconductor devices according to a third embodiment of the present invention, wherein FIG. 3(a) shows a fuse in a state in which the fuse is not blown, FIGS. 3(b) and 3(c) each show a fuse in a state in which the fuse is blown;

FIG. 4 shows examples of possible patterns of insufficient blowing of a fuse, wherein FIG. 4(a) shows a schematic view of a fuse in which the fuse shown in FIG. 1(a) is blown insufficiently, FIG. 4(b) shows a fuse in a state in which the fuse shown in FIG. 2(a) is blown insufficiently, and FIG. 4(c) shows a fuse in a state in which the fuse shown in FIG. 3(a) is blown insufficiently;

FIG. 5 is a schematic view showing a fuse for use in semiconductor devices according to a fourth embodiment of the present invention, wherein FIG. 5(a) shows a fuse in a state in which the fuse is not blown, FIGS. 5(b) and 5(c) each show a fuse in a state in which the fuse is blown; and FIG. 6 is a schematic view showing a conventional fuse for use in semiconductor devices, wherein FIG. 6(a) shows a fuse in a state in which the fuse is not blown, FIGS. 6(b) and 6(c) each show a fuse in a state in which the fuse is blown.

DETAILED DESCRIPTION OF THE PREFERRED EMBODIMENTS

In the following paragraphs, some preferred embodiments of the present invention will be described by way of example and not limitation. It should be understood based on this disclosure that various other modifications can be made by those in the art based on these illustrated embodiments.

Hereinafter, some preferable embodiments of the present invention will be explained with reference to the attached drawings. In the following explanation, although the entire structure of a semiconductor device equipped with a fuse will not be explained, it should be understood that the present invention can be applied to various semiconductor devices having fuses for disconnecting a part of circuit wiring to change circuit wiring by blowing one or a plurality of fuses as needed.

First Embodiment

Figure 1:
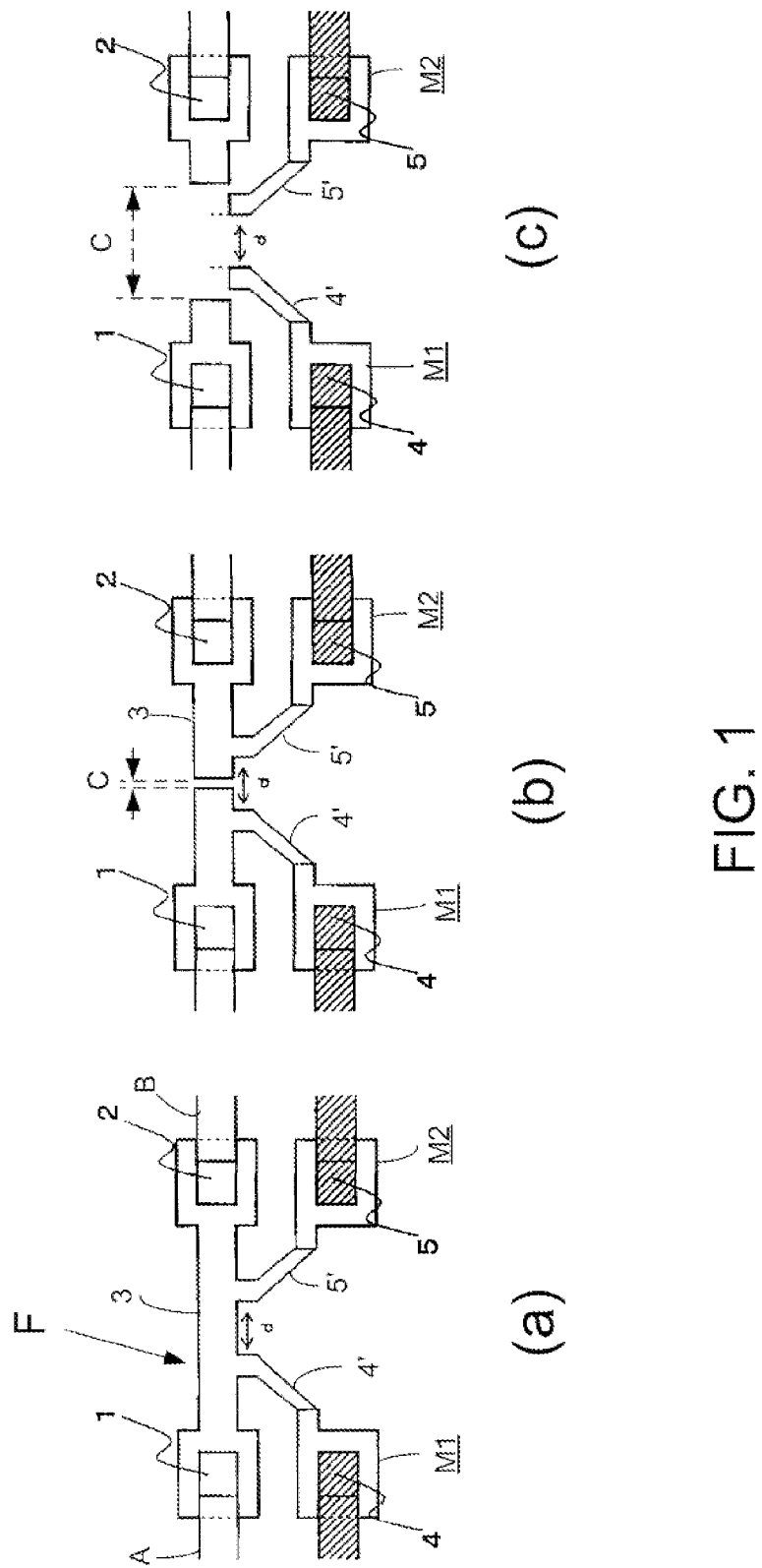

FIG. 1 is a schematic view showing a fuse for use in semiconductor devices according to a first embodiment of the present invention. FIG. 1(a) shows a fuse in a state in which the fuse is not blown, FIG. 1(b) shows a fuse in a state in which the fuse is blown and an insufficiently small clearance "C" is formed, and FIG. 1(c) shows a fuse in a state in which the fuse is blown and a sufficiently large clearance "C" is formed.

In the fuse shown in FIG. 1(a), a fuse F made of a known material connects a circuit A and a circuit B of a semiconductor circuit (not shown) and includes a first pad 1 connected to the circuit A, a second pad 2 connected to the circuit B, and a conductive portion 3 having a constant width along the length thereof. The conductive portion 3 includes end portions arranged to surround the pad 1 (2) and a part of the circuit A (B). This fuse F constitutes one of fusing circuits of the semiconductor device. In this fuse F, when it is required to disconnect the circuit A and the circuit B, electrical stress is applied to both ends of the fuse F to blow the longitudinally intermediate portion of the conductive portion 3 to disconnect the fusing circuit.

In this embodiment shown in FIG. 1(a), a pair of monitor wirings M1 and M2, i.e., the left side monitor wiring M1 (hereinafter referred to as "first monitoring wiring") and the right side monitor wiring M2 (hereinafter referred to as "second monitoring wiring"), are arranged. The first monitor wiring M1 has a pad 4 and a wiring portion 4' electrically connected to the pad 4, and the second monitor wiring M2 has a pad 5 and a wiring portion 5' electrically connected to the pad 5.

The pad 4 of the first monitor wiring M1 is arranged adjacent to the first pad 1 (left side pad) of the fuse F at one side of the fuse F, and the pad 5 of the second monitor wiring M2 is arranged adjacent to the second pad 2 (right side pad) of the fuse F at the same side of the fuse F. With this arrangement, the wiring portion 4' of the first monitor wiring M1 extends to the conductive portion 3 of the fuse F and is electrically connected to a first portion of the conductive portion 3 away from the longitudinal center of the conductive portion 3 leftward by a distance "d/2," and the wiring portion 5' of the right side monitor wiring M2 extends to the conductive portion 3 of the fuse F and is electrically connected to a second portion of the conductive portion 3 of the fuse F away from the longitudinal center of the conductive portion 3 rightward by a distance "d/2." In this way, the wiring portion 4' of the first monitor wiring M1 and the wiring portion 5' of the second monitor wiring M2 are electrically connected to the conductive portion 3 of the fuse F with a distance "d" away from each other as shown in FIG. 1(a).

In this embodiment, when the fuse F is blown by applying electric stress, a clearance "C" will be formed at the longitudinal center of the conductive portion 3 of the fuse F as shown in, for example, FIGS. 1(b) and 1(c). In the case shown in FIG. 1(b), however, the clearance "C" formed at the conductive portion 3 is insufficiently small, which may cause reconnection of the fused end faces when, e.g., temperature tress or force stress is applied. In this case, although the first and second pads 1 and 2 of the fuse F are electrically disconnected, the first pad 1 of the fuse F and the pad 4 of the first monitor wiring M1 are electrically connected, and the second pad 2 of the fuse F and the pad 5 of the second monitor wiring M2 are electrically connected. Therefore, the electric connection between the first pad 1 of the fuse F and the pad 4 of the first monitor wiring M1 can be confirmed using, e.g., an IC tester. In the same manner, the electric connection between the second pad 2 of the fuse F and the pad 5 of the second monitor wiring M2 can be confirmed. If one or both of the electric connections are confirmed, it can be concluded that the clearance "C" is insufficiently small. This means that the blowing of the fuse was performed insufficiently, which in turn indicates possible occurrence of accidental reconnection of the fuse.

On the other hand, in the case shown in FIG. 1(c), the clearance "C" formed at the conductive portion 3 of the fuse F is sufficiently large. In this case, all of the pads 1, 2, 4 and 5 are electrically disconnected with each other. In this case, the electric disconnection between the first pad 1 of the fuse F and the pad 4 of the first monitor wiring M1 can be confirmed using, e.g., an IC tester. In the same manner, the electric disconnection between the second pad 2 of the fuse F and the pad 5 of the second monitor wiring M2 can be confirmed. When both the disconnections are confirmed, it can be concluded that the clearance "C" is sufficient. This means that the blowing of the fuse F is successfully performed, which in turn indicates no possible occurrence of accidental reconnection of the fuse.

In this embodiment, the wiring portions 4' and 5' of the first and second monitor wirings M1 and M2 are connected to the first portion and the second portion of the conductive portion 3 of the fuse F, respectively, with a distance therebetween. In other words, the distance "d" between the wiring portions 4' and 5' of the first and second monitor wirings M1 and M2 is preferably set to be smaller than a clearance "C" of the fuse F to be formed by blowing. Considering the width "t" of each wiring portion 4' and 5', it is more preferable that the distance of the outer edges of the wiring portions 4' and 5' (i.e., "d+2t") is smaller than a clearance "C" to be formed by blowing as shown in FIG. 1(c).

In this embodiment, the wiring portions 4' and 5' of the first and second monitor wirings M1 and M2 are connected to the conductive portion of the fuse F so as to be positioned within a blow-off target area of the conductive portion 3 of the fuse F defined by a sufficiently large clearance "C."

Second Embodiment

Figure 2:
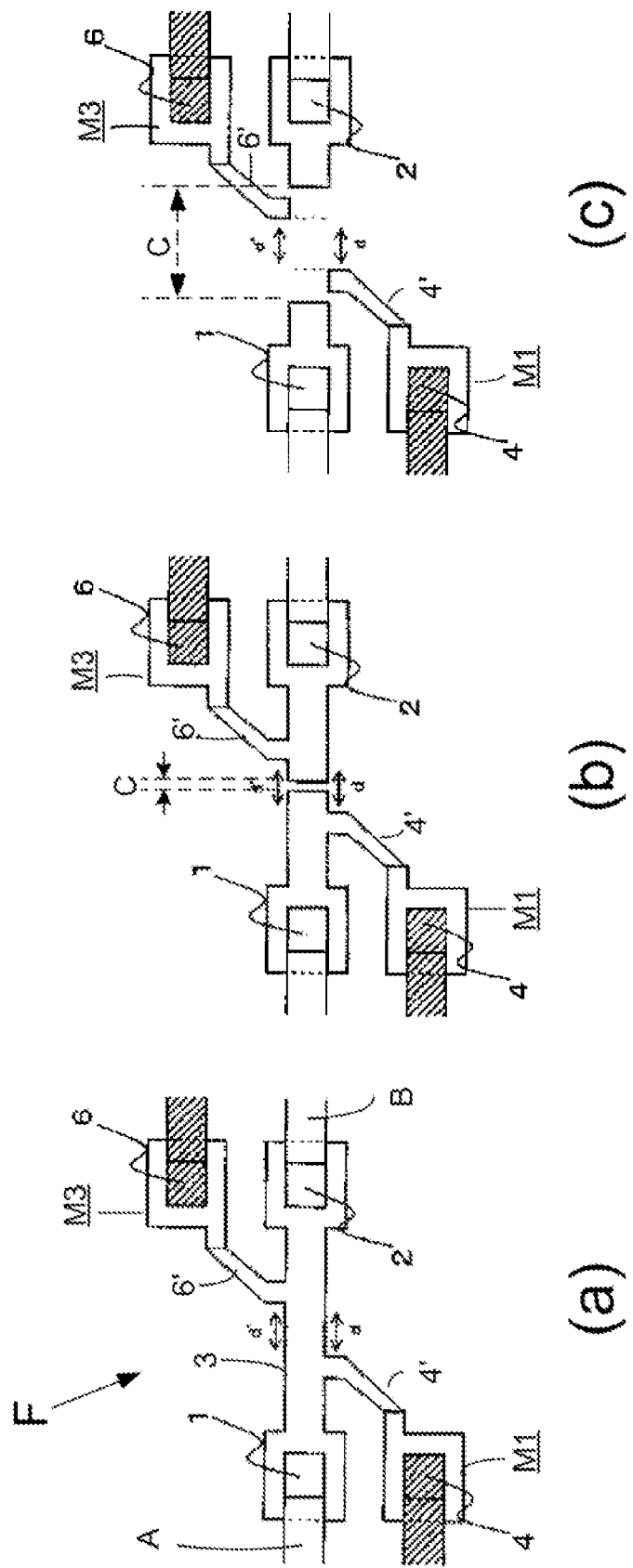

FIG. 2 is a schematic view showing a fuse for use in semiconductor devices according to a second embodiment of the present invention. FIG. 2(a) shows a fuse in a state in which the fuse is not blown, FIG. 2(b) shows a fuse in a state in which the fuse is blown and an insufficiently small clearance "C" is formed, and FIG. 2(c) shows a fuse in a state in which the fuse is blown and a sufficiently large clearance "C" is formed.

In FIG. 2, the same reference numeral is allotted to the same or corresponding portion of the first embodiment shown in FIG. 1, and the cumulative explanations are omitted by allotting the same reference numeral. The following explanation will be mainly directed to the structure different from that of the first embodiment.

In this second embodiment, in the same manner as in the first embodiment, a pair of monitor wirings M1 and M3, i.e., the left lower side monitor wiring M1 (hereinafter referred to as "first monitoring wiring") and the right upper side monitor wiring M3 (hereinafter referred to as "second monitoring wiring"), are arranged. Different from the first embodiment, in this embodiment, the first monitor wiring M1 is arranged at one side of the fuse F (left lower side of the fuse F in FIG. 2(a)), while the second monitor wiring M3 is arranged at the other side of the fuse F (right upper side of the fuse F in FIG. 2(a)). More specifically, as shown in FIG. 2(a), the pad 4 of the first monitor wiring M1 is arranged adjacent to the first pad 1 (left side pad) of the fuse F at one side of the fuse F, while the pad 6 of the second monitor wiring M3 is arranged adjacent to the second pad 2 (right side pad) of the fuse F at the other side of the fuse F. In other words, the pad 4 of the first monitor wiring M1 and the pad 6 of the second monitor wiring M3 are arranged diagonally with respect to the fuse F.

With this arrangement, the wiring portion 4' of the first monitor wiring M1 is electrically connected to a first portion of the conductive portion 3 of the fuse F which is away from the longitudinal center of the conductive portion 3 leftward by a distance "d/2," and the wiring portion 6' of the second monitor wiring M3 is electrically connected to a second portion of the conductive portion 3 of the fuse F which is away from the longitudinal center of the conductive portion 3 rightward by a distance "d/2." In this way, the wiring portion 4' of the first monitor wiring M1 and the wiring portion 6' of the second monitor wiring M2 are electrically connected to the conductive portion 3 of the fuse F with a distance "d" therebetween.

In this embodiment, when the fuse is blown, a clearance "C" will be formed in the longitudinal center of the conductive portion 3 of the fuse F as shown in, for example, FIGS. 2(a) and 2(b). In the case shown in FIG. 2(b), however, the clearance "C" formed in the conductive portion 3 is insufficiently small, which may cause reconnection of the fused end faces when, e.g., temperature tress or force stress is applied. In this case, although the first pad 1 and the second pad 2 of the fuse F are electrically disconnected, the first pad 1 of the fuse F and the pad 4 of the first monitor wiring M1 are electrically connected, and the second pad 2 of the fuse F and the pad 6 of the second monitor wiring M3 are electrically connected. In this case, the electric connection between the first pad 1 of the fuse F and the pad 4 of the first monitor wiring M1 can be confirmed using, e.g., an IC tester. In the same manner, the electric connection between the second pad 2 of the fuse F and the pad 6 of the second monitor wiring M3 can be confirmed. If one or both of the electric connections are confirmed, it can be concluded that the clearance "C" is insufficiently small. This means that the blowing of the fuse was performed insufficiently, which in turn indicates possible occurrence of accidental reconnection of the fuse.

On the other hand, in the case shown in FIG. 2(c), the clearance "C" formed in the conductive portion 3 of the fuse F is sufficiently large. In this case, all of the pads 1, 2, 4 and 6 are electrically disconnected with each other. In this case, the electric disconnection between the first pad 1 of the fuse F and the pad 4 of the first monitor wiring M1 can be confirmed using, e.g., an IC tester. In the same manner, the electric disconnection between the second pad 2 of the fuse F and the pad 6 of the second monitor wiring M3 can be confirmed. When both the disconnections are confirmed, it can be concluded that the clearance "C" is sufficiently large. This means that the blowing of the fuse is performed sufficiently, which in turn indicates no possible occurrence of accidental reconnection of the fuse.

Also in this embodiment, the wiring portion 4' and 6' are connected to the first and second portions of the conductive portion 3 of the fuse F to be blown off which fall within a blown-off target area. In other words, the distance "d" between the wiring portions 4' and 6' of the first and second monitor wirings M1 and M3 is preferably set to be smaller than a sufficiently large clearance "C" of the fuse F to be formed by blowing. Considering the width "t" of each wiring portion 4' and 5', it is more preferable that the distance of the outer edges of the wiring portions 4' and 6' (i.e., "d+2t") is smaller than the sufficiently large clearance "C" to be formed by flowing as shown in FIG. 1(c).

Third Embodiment

Figure 3:
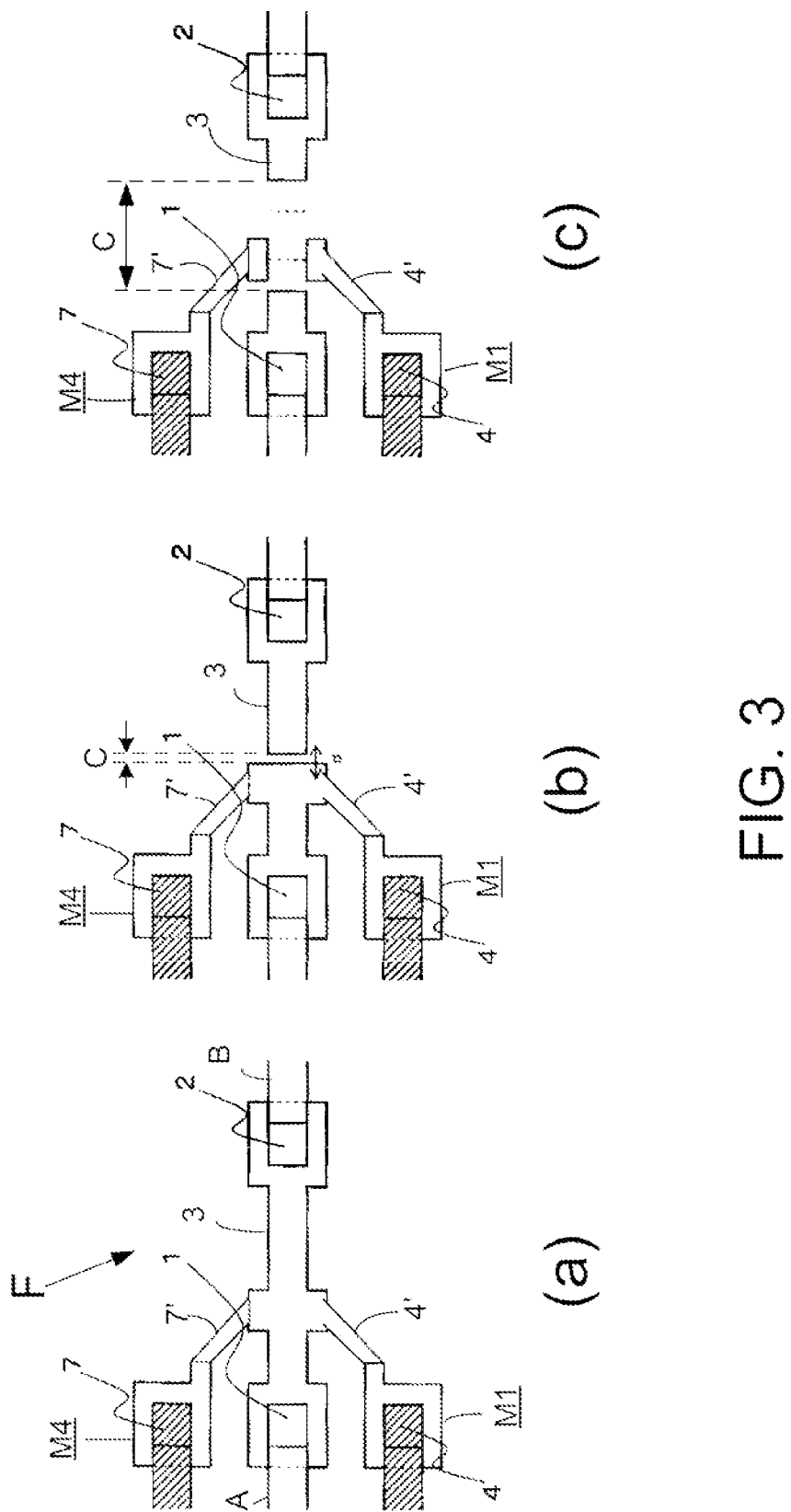

FIG. 3 is a schematic view showing a fuse for use in semiconductor devices according to a third embodiment of the present invention. FIG. 3(a) shows a fuse in a state in which the fuse is not blown, FIG. 3(b) shows a fuse in a state in which the fuse is blown but an insufficiently small clearance "C" is formed, and FIG. 3(c) shows a fuse in a state in which the fuse is blown and a sufficiently large clearance is formed.

In FIG. 3, the same reference numeral is allotted to the same or corresponding portion of the first embodiment shown in FIG. 1, and the cumulative explanations are omitted by allotting the same reference numeral. The following explanation will be mainly directed to the structure different from that of the first embodiment.

In this third embodiment, in the same manner as in the first embodiment, a pair of monitor wirings M1 and M4, i.e., the left lower side monitor wiring M1 (hereinafter referred to as "first monitoring wiring") and the left upper side monitor wiring M4 (hereinafter referred to as "second monitoring wiring"), are arranged. However, in this embodiment, the first monitor wiring M1 is arranged at one side of the fuse F (left lower side of the fuse F in FIG. 3(a)), while the second monitor wiring M4 is arranged at the other side of the fuse F (left upper side of the fuse F in FIG. 3(a)). More specifically, as shown in FIG. 3(a), the pad 4 of the first monitor wiring M1 is arranged adjacent to the first pad 1 (left side pad) of the fuse F at one side of the fuse F, while the pad 7 of the second monitor wiring M4 is arranged adjacent to the first pad 1 (left side pad) of the fuse F at the other side of the fuse F. In other words, the pad 4 of the first monitor wiring M1 and the pad 7 of the second monitor wiring M4 are arranged at opposite sides of the fuse F so as to sandwich the first pad 1 of the fuse F.

With this arrangement, both the wiring portion 4' of the first monitor wiring M1 and the wiring portion 7' of the second monitor wiring M4 are electrically connected to the same portion of the conductive portion 3 of the fuse F which is away from the longitudinal center of the conductive portion 3 leftward. In other words, both the wiring portion 4' and 7' of the first and second monitor wirings M1 and M4 are electrically connected to the portion of the conductive portion 3 falling within a blown-off targeted area of the conductive portion 3.

In this embodiment, when the fuse is blown, a clearance "C" will be formed in the longitudinal center of the conductive portion 3 of the fuse F as shown in, for example, FIGS. 3(a) and 3(b). In the case shown in FIG. 3(b), however, the clearance "C" formed in the conductive portion 3 is insufficiently small, which may cause reconnection of the fused end faces by, e.g., temperature tress or force stress. In this case, although the first and second pads 1 and 2 of the fuse F are electrically disconnected, the first pad 1 of the fuse F and the pad 4 of the first monitor wiring M1 are electrically connected, and the first pad 1 of the fuse F and the pad 7 of the second monitor wiring M4 are electrically connected. Therefore, the electric connection between the first pad 1 of the fuse F and the pad 4 of the first monitor wiring M1 and between the first pad 1 of the fuse F and the pad 7 of the second monitor wiring M4 can be confirmed using, e.g., an IC tester. If one or both of the electric connections are confirmed, it can be concluded that the clearance "C" is insufficiently small. This means that the blowing of the fuse was performed insufficiently, which in turn indicates possible occurrence of accidental reconnection of the fuse.

On the other hand, in the case shown in FIG. 3(c), the clearance "C" formed in the conductive portion 3 of the fuse F is sufficiently large. In this case, all of the pads 1, 2, 4 and 7 are electrically disconnected with each other. In this case, the electric disconnection between adjacent two pads, i.e., between the first pad 1 of the fuse F and the pad 4 of the first monitor wiring M1, between the first pad 1 of the fuse F and the pad 7 of the second monitor wiring M4, between the first and second pads 1 and 2 of the fuse F, between the second pad 2 of the fuse F and the pad 4 of the first monitor wiring M1, and between the second pad 2 of the fuse F and the pad 7 of the second monitor wiring M4, can be confirmed using, e.g., an IC tester. When all of the disconnections are confirmed, it can be concluded that the clearance "C" is sufficiently large. This means that the blowing of the fuse was performed sufficiently, which in turn indicates no possible occurrence of accidental reconnection of the fuse.

Also in this embodiment, the wiring portion 4' and 7' are connected to the same portion of the conductive portion 3 of the fuse F to be blown off, which is located at the left end of the blown-off targeted portion of the conductive portion 3 of the fuse F.

Forth Embodiment

Figure 5:
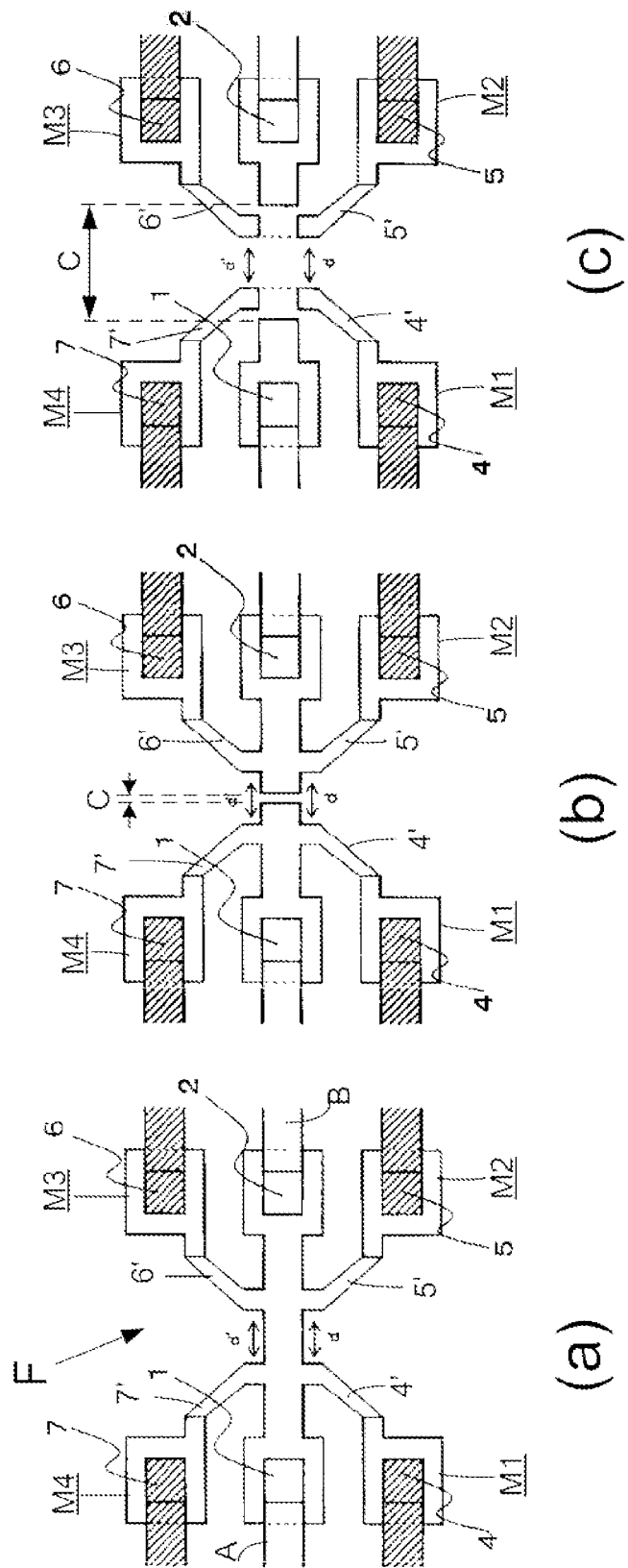
Figure 6:
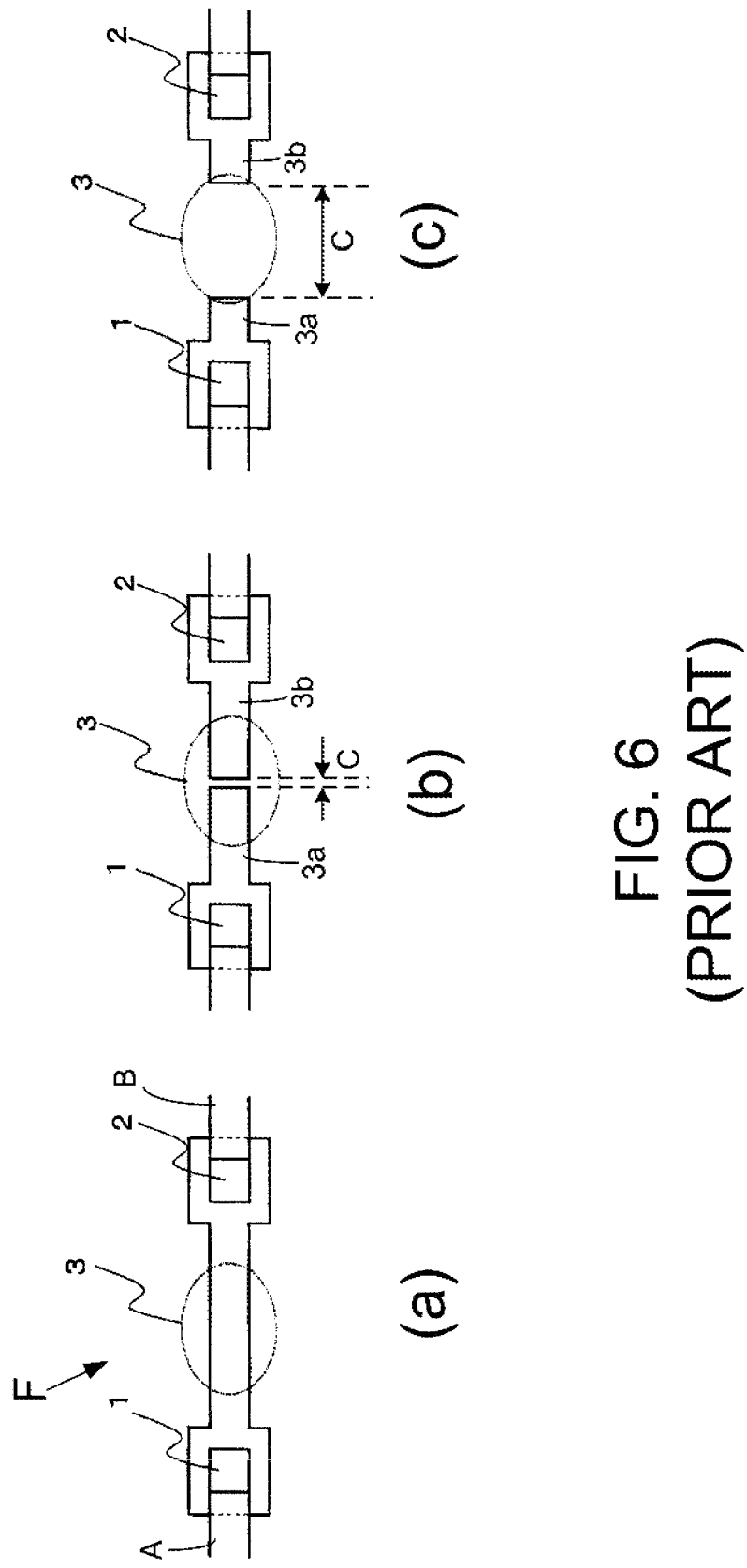

FIG. 5 is a schematic view showing a fuse for use in semiconductor devices according to a fourth embodiment of the present invention. FIG. 5(a) shows a fuse in a state in which the fuse is not blown, FIG. 5(b) shows a fuse in a state in which the fuse is blown but an insufficiently small clearance is formed, and FIG. 5(c) shows a fuse in a state in which the fuse is blown and a sufficiently large clearance is formed.

In FIG. 5, the same reference numeral is allotted to the same or corresponding portion of the embodiments shown in FIGS. 1 to 3, and the cumulative explanations are omitted by allotting the same reference numeral. The following explanation will be mainly directed to the structure different from that of the first embodiment.

Figure 4:
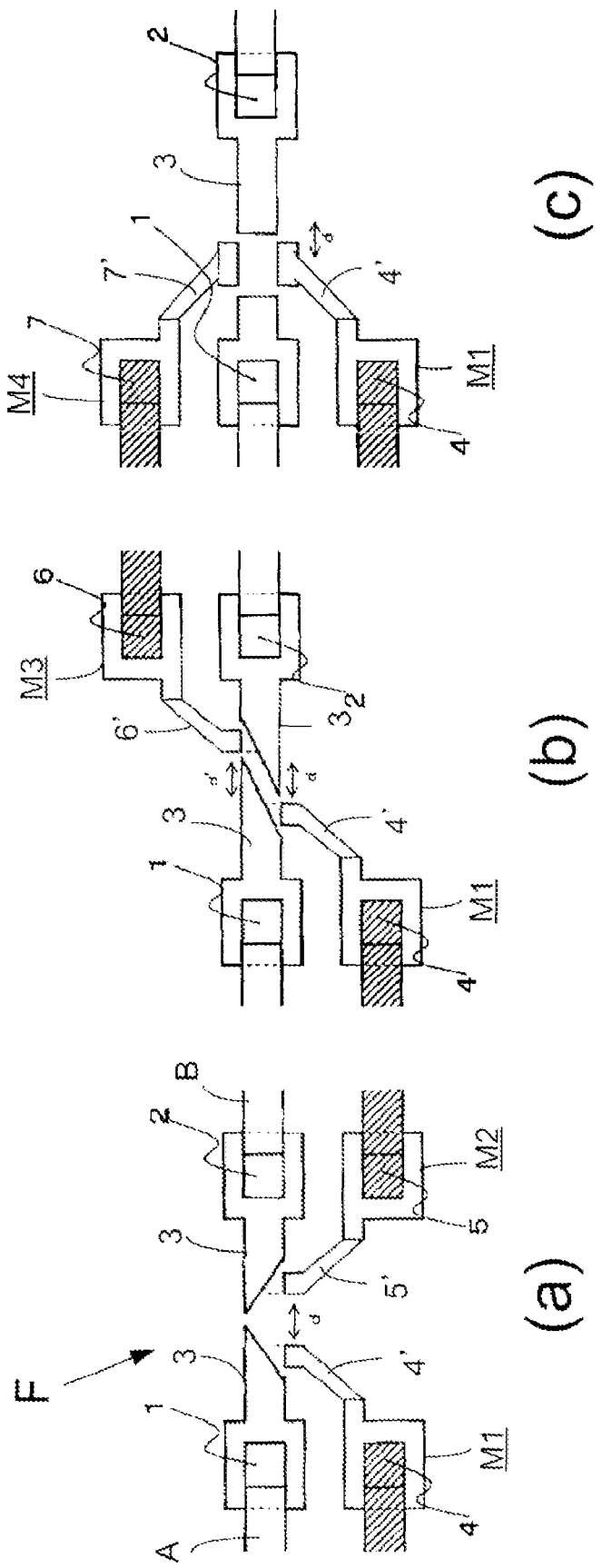

In the meantime, in the aforementioned first to third embodiments, an insufficiently small clearance "C" as shown in FIGS. 4(a) to 4(c) might occur. In each case, there is a possible occurrence of accidental reconnection of the fuse. If such insufficient blowing should occur, the electrical tests will fail to recognize the problem since all of the pads are electrically disconnected with each other regardless of the insufficient clearance "C." This deteriorates the reliability. In order to more assuredly enhance the reliability, in the fourth embodiment shown in FIG. 5(a), a total of four monitor wirings M1, M2, M3 and M4 are employed. Specifically, as shown in FIG. 5(a), the pad 4 of the first monitor wiring M1 is arranged adjacent to the first pad 1 (left side pad) of the fuse F at one side of the fuse F, the pad 5 of the second monitor wiring M2 is arranged adjacent to the second pad 2 (right side pad) of the fuse F at the same side of the fuse F, the pad 6 of the third monitor wiring M3 is arranged adjacent to the second pad 2 (right side pad) of the fuse F at the other side of the fuse F, and the pad 7 of the third monitor wiring M4 is arranged adjacent to the first pad 1 (left side pad) of the fuse F at the other side of the fuse F. The wiring portion 4' of the first monitor wiring M1 and the wiring portion 7' of the fourth monitor wiring M4 are electrically connected to the same portion of the conductive portion 3 of the fuse F which is away from the longitudinal center of the conductive portion 3 leftward, and the wiring portion 5' of the second monitor wiring M2 and the wiring portion 6' of the third monitor wiring M3 are electrically connected to the same portion of the conductive portion 3 of the fuse F which is away from the longitudinal center of the conductive portion 3 rightward. Accordingly, the wiring portions 4' and 7' of the first and fourth monitor wirings M1 and M4 connected to the first portion of the conductive portion 3 of the fuse F and the wiring portions 5' and 6' of the second and third monitor wirings M2 and M3 connected to the second portion of the conductive portion 3 of the fuse F are away from each other by a distance "d" as shown in FIG. 5(a).

With this arrangement, all of the pads 4, 5, 6, and 7 are electrically connected. In this embodiment, when the fuse is blown, a clearance "C" will be formed in the longitudinal center of the conductive portion 3 of the fuse F as shown in, for example, FIGS. 5(b) and 5(c). In the case shown in FIG. 5(b), however, the clearance "C" formed in the conductive portion 3 is insufficiently small, which may cause reconnection of the fused end faces when, e.g., temperature tress or force stress is applied. In this case, if at least one the electric connection between monitor wirings and the pads of the fuse is confirmed, it can be concluded that the clearance "C" is insufficiently small. This means that the blowing of the fuse was performed insufficiently, which in turn indicates possible occurrence of accidental reconnection of the fuse.

On the other hand, in the case shown in FIG. 5(c), the clearance "C" formed in the conductive portion 3 of the fuse F is sufficiently large. In this case, all of the pads 1, 2, 4, 5, 6, and 7 are electrically disconnected with each other. In this case, all of the electric disconnections between the pads can be confirmed using, e.g., an IC tester. This means that the blowing of the fuse was performed sufficiently, which in turn indicates no possible occurrence of accidental reconnection of the fuse. The structure of this fourth embodiment has a disadvantage in terms of the costs but can significantly increase the reliability.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein. For example, in the aforementioned embodiments, the monitor wirings M1, M2, M3 and M4 are arranged at two or four positions around the fuse F, but can be arranged at three, five, or more positions. Furthermore, the wiring portion and the pad of the monitor wiring is not specifically limited in shape, width, size, etc., and can be arbitrarily designed.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A semiconductor device comprising:
   a fuse having a conductive portion configured to be blown when a current exceeding a rated value flows through the conductive portion;
   a first monitor wiring configured to monitor blowing of the conductive portion of the fuse; and
   a second monitor wiring configured to monitor blowing of the conductive portion of the fuse,
   wherein the first monitor wiring is connected to the conductive portion of the fuse so as to be away from a longitudinal center of the conductive portion, and
   wherein the second monitor wiring is connected to the conductive portion of the fuse so as to be away from a longitudinal center of the conductive portion.

2. The semiconductor device as recited in claim 1,
   wherein the fuse has a pair of pads and the conductive portion electrically connecting the pads, the first monitor wiring includes a pad and a wiring portion, and the second monitor wiring including a pad and a wiring portion,
   wherein the wiring portion of the first monitor wiring is connected to a first portion of the conductive portion of the fuse which is away from the longitudinal center of the conductive portion by a certain distance, and wherein the wiring portion of the second monitor wiring is connected to a second portion of the conductive portion of the fuse which is away from the longitudinal center of the conductive portion by a certain distance.

3. The semiconductor device as recited in claim 2, wherein the first portion of the conductive portion is away from the longitudinal center of the conductive portion in one longitudinal direction of the conductive portion, and the second portion of the conductive portion is away from the longitudinal center of the conductive portion in the other longitudinal direction of the conductive portion.

4. The semiconductor device as recited in claim 2, wherein the first portion of the conductive portion and the second portion of the conductive portion are away from the longitudinal center of the conductive portion in the same longitudinal direction of the conductive portion by the same distance.

5. The semiconductor device as recited in claim 2, wherein the wiring portion of the first monitor wiring and the wiring portion of the second monitor wiring are connected to end portions of the conductive portion of the fuse to be blown.

6. The semiconductor device as recited in claim 2, wherein the pad of the first monitor wiring is arranged adjacent to one of the pair of pads of the fuse at one side of the fuse and the wiring portion of the first monitor wiring is connected to the conductive portion of the fuse at the one side of the fuse, and the pad of the second monitor wiring is arranged adjacent to the other of the pair of pads of the fuse at the one side of the fuse and the wiring portion of the second monitor wiring is connected to the conductive portion of the fuse at the one side of the fuse.

7. The semiconductor device as recited in claim 6, wherein the wiring portion of the first monitor wiring is connected to a first portion of the conductive portion of the fuse to be blown, wherein the wiring portion of the second monitor wiring is connected to a second portion of the conductive portion of the fuse to be blown, and wherein the first portion and the second portion are away from each other from the longitudinal center of the conductive portion of the fuse.

8. The semiconductor device as recited in claim 2, wherein the pad of the first monitor wiring is arranged adjacent to one of the pair of pads of the fuse at one side of the fuse and the wiring portion of the first monitor wiring is connected to the conductive portion of the fuse at the one side of the fuse, and the pad of the second monitor wiring is arranged adjacent to the other of the pair of pads of the fuse at the other side of the fuse and the wiring portion of the second monitor wiring is connected to the conductive portion of the fuse at the other side of the fuse.

9. The semiconductor device as recited in claim 8, wherein the wiring portion of the first monitor wiring is connected to a first portion of the conductive portion of the fuse to be blown, wherein the wiring portion of the second monitor wiring is connected to a second portion of the conductive portion of the fuse to be blown, and wherein the first portion and the second portion are away from each other from the longitudinal center of the conductive portion of the fuse.

10. The semiconductor device as recited in claim 2, wherein the pad of the first monitor wiring is arranged adjacent to one of the pair of pads of the fuse at one side of the fuse and the wiring portion of the first monitor wiring is connected to the conductive portion of the fuse at the one side of the fuse, and the pad of the second monitor wiring is arranged adjacent to the one of the pair of pads of the fuse at the other side of the fuse and the wiring portion of the second monitor wiring is connected to the conductive portion of the fuse at the other side of the fuse.

11. The semiconductor device as recited in claim 9, wherein the semiconductor device as recited in claim 5, wherein the wiring portion of the first monitor wiring and the wiring portion of the second monitor wiring are connected to a portion of the conductive portion of the fuse to be blown.

12. The semiconductor device as recited in claim 2, further comprising a third monitor wiring configured to monitor blowing of the conductive portion of the fuse, the third monitor wiring including a pad and a wiring portion, and a fourth monitor wiring configured to monitor blowing of the conductive portion of the fuse, the fourth monitor wiring including a pad and a wiring portion,
wherein the pad of the first monitor wiring is arranged adjacent to one of the pair of pads of the fuse at one side of the fuse and the wiring portion of the first monitor wiring is connected to the conductive portion of the fuse at the one side of the fuse, the pad of the second monitor wiring is arranged adjacent to the other of the pair of pads of the fuse at the one side of the fuse and the wiring portion of the second monitor wiring is connected to the conductive portion of the fuse at the one side of the fuse, the pad of the third monitor wiring is arranged adjacent to the other of the pair of pads of the fuse at the other side of the fuse and the wiring portion of the third monitor wiring is connected to the conductive portion of the fuse at the other side of the fuse, the pad of the fourth monitor wiring is arranged adjacent to the one of the pair of pads of the fuse at the other side of the fuse and the wiring portion of the fourth monitor wiring is connected to the conductive portion of the fuse at the other side of the fuse.

13. The semiconductor device as recited in claim 12, wherein the wiring portion of the first monitor wiring and the wiring portion of the fourth monitor wiring are connected to a first portion of the conductive portion of the fuse to be blown, and the wiring portion of the second monitor wiring and the wiring portion of the third monitor wiring are connected to a second portion of the conductive portion of the fuse to be blown.

14. A semiconductor device comprising:
a fuse having a conductive portion configured to be blown when a current exceeding a rated value flows through the conductive portion;
a first monitor wiring configured to monitor blowing of the conductive portion of the fuse; and
a second monitor wiring configured to monitor blowing of the conductive portion of the fuse,
wherein the first monitor wiring and the second monitor wiring are connected to the conductive portion of the fuse so as to be positioned within a blow-off target area of the conductive portion of the fuse.

15. The semiconductor device as recited in claim 14,
wherein the fuse has a pair of pads and the conductive portion electrically connecting the pads, the first monitor wiring includes a pad and a wiring portion, and the second monitor wiring including a pad and a wiring portion,
wherein the wiring portions of the first monitor wiring and the second monitor wiring are connected to the conductive portion of the fuse so as to be away from the longitudinal center of the conductive portion.

16. A method of monitoring blowing of a fuse in a semiconductor device, the method comprising:
providing a fuse in the semiconductor device, the fuse having a conductive portion configured to be blown when a current exceeding a rated value flows through the conductive portion;

providing a first monitor wiring and a second monitor wiring in the semiconductor device so that the first and second monitor wirings are connected to the conductive portion of the fuse so as to be away from a longitudinal center of the conductive portion, the first monitor wiring and the second monitor wiring being configured to monitor blowing of the conductive portion of the fuse; and monitoring electric disconnection of the conductive portion of the fuse using the first monitor wiring and second monitor wiring to confirm, after blowing of the conductive portion of the fuse, whether or not remaining portions of the fuse and the first and second monitor wirings are electrically disconnected with each other.

* * * * *